(12) United States Patent
Lee

(10) Patent No.: US 9,269,650 B2
(45) Date of Patent: Feb. 23, 2016

(54) CHIP-ON-FILM PACKAGE AND DISPLAY DEVICE INCLUDING THE SAME

(71) Applicant: Samsung Display Co., Ltd., Yongin, Gyeonggi-do (KR)

(72) Inventor: Hee Kwon Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/165,491

(22) Filed: Jan. 27, 2014

(65) Prior Publication Data

US 2015/0028363 A1    Jan. 29, 2015

(30) Foreign Application Priority Data

Jul. 24, 2013    (KR) .......................... 10-2013-0087551

(51) Int. Cl.
*H01L 23/48*    (2006.01)
*G02F 1/1345*    (2006.01)
*H01L 23/498*    (2006.01)

(52) U.S. Cl.
CPC .......... *H01L 23/481* (2013.01); *G02F 1/13452* (2013.01); *H01L 23/4985* (2013.01); *H01L 23/49827* (2013.01); *H01L 2924/0002* (2013.01)

(58) Field of Classification Search
CPC ............. H05K 7/02; H05K 1/028; G02F 1/13
USPC ................................................. 257/E23.177
See application file for complete search history.

(56) References Cited

U.S. PATENT DOCUMENTS

| 2001/0009299 | A1* | 7/2001 | Saito ............................. 257/684 |
| 2005/0040504 | A1* | 2/2005 | Kang et al. .................... 257/678 |
| 2013/0293816 | A1* | 11/2013 | Jung et al. ..................... 349/139 |

FOREIGN PATENT DOCUMENTS

| JP | 2008-124317 A | 5/2008 |
| KP | 10-2012-0042079 A | 5/2012 |
| KR | 10-0652519 B1 | 12/2006 |
| KR | 10-0671660 B1 | 1/2007 |
| KR | 10-2009-0127678 A | 12/2009 |
| KR | 10-2012-0049733 A | 5/2012 |

OTHER PUBLICATIONS

Korean Patent Abstracts No. 10-2006-0036623 A for Patent No. KR 10-0671660, 2 pages.

* cited by examiner

*Primary Examiner* — Michael Jung
*Assistant Examiner* — Mikka Liu
(74) *Attorney, Agent, or Firm* — Lewis Roca Rothgerber Christie LLP

(57) ABSTRACT

A chip-on-film package includes a base film including a bending area, an integrated circuit chip at an upper surface of the base film, a first line at the upper surface of the base film and overlapping the bending area, a second line at a lower surface of the base film and overlapping the bending area, a via pattern penetrating the base film to electrically couple the first line and the second line, and a common line coupled to the first line and to the integrated circuit chip, wherein at least a portion of the first line does not overlap at least a portion of the second line in a plan view.

18 Claims, 6 Drawing Sheets

CHIP-ON-FILM PACKAGE AND DISPLAY DEVICE INCLUDING THE SAME

CROSS-REFERENCE TO RELATED APPLICATION

This application claims priority to and the benefit of Korean Patent Application No. 10-2013-0087551, filed on Jul. 24, 2013, the contents of which are hereby incorporated by reference.

BACKGROUND

1. Field

Embodiments of the present invention relate to a chip-on-film package and a display device including the same.

2. Description of the Related Art

A display device includes a display panel, a printed circuit board that drives the display panel, and a tape carrier package (TCP) or a chip-on-film (COF) package that electrically couples the printed circuit board to the display panel.

Use of the COF package increases because of advantages of the COF package when compared to the TCP, such as a relatively small thermal expansion coefficient, superior flexibility, relatively thin film, fine pitch, etc.

One end of the COF package is attached to an upper surface of the display panel, and the COF package is bent to be located on a lower surface of the display panel. When a bending area of the COF package exceeds a limit radius of curvature, or when bending stress is accumulated or concentrated in the bending area, cracking may occur at or around the bending area. Due to cracking, wires in the COF package may be damaged, or defects in driving of the COF package may occur, thereby deteriorating display quality of the display device.

SUMMARY

Embodiments of the present invention provide a chip-on-film package capable of reducing or preventing wire cracking in a bending area, and also provide a display device including the chip-on-film package.

Embodiments of the present invention provide a chip-on-film package including a base film including a bending area, an integrated circuit chip at an upper surface of the base film, a first line at the upper surface of the base film and overlapping the bending area, a second line at a lower surface of the base film and overlapping the bending area, a via pattern penetrating the base film to electrically couple the first line and the second line, and a common line coupled to the first line and to the integrated circuit chip, wherein at least a portion of the first line does not overlap at least a portion of the second line in a plan view.

The common line may extend along a first direction, and the first line and the second line may be symmetrical to each other about an axis extending along the first direction.

The common line might not overlap the bending area.

The common line may include a first common line coupling a first end of the first line to the integrated circuit chip, and a second common line coupled to a second end of the first line.

The first line and the second line may cross the bending area.

The first line may include a first upper extension part, a first lower extension part spaced from and facing the first upper extension part, and a first intermediate line coupling the first upper extension part and the first lower extension part, and the second line may include a second upper extension part, a second lower extension part spaced from and facing the second upper extension part, and a second intermediate line coupling the second upper extension part and the second lower extension part.

A width of the first intermediate line may be smaller than a width of the first upper extension part and a width of the first lower extension part, and a width of the second intermediate line may be smaller than a width of the second upper extension part and a width of the second lower extension part.

The first intermediate line might not overlap the second intermediate in a plan view.

The first upper extension part may overlap the second upper extension part in a plan view, and the first lower extension part may overlap the second lower extension part in a plan view.

The via pattern may include a first via pattern coupling the first upper extension part and the second upper extension part, and a second via pattern coupling the first lower extension part and the second lower extension part.

The chip-on-film package may further include a first protection layer at the upper surface of the base film to protect the first line and the common line, and a second protection layer at the lower surface of the base film to protect the second line.

Embodiments of the present invention provide a display device including a display panel for displaying an image, a printed circuit board for driving the display panel, and a chip-on-film package for electrically coupling the display panel and the printed circuit board, the chip-on-film package including a base film including a bending area, an integrated circuit chip at an upper surface of the base film, a first line at the upper surface of the base film and overlapping the bending area, a second line at a lower surface of the base film and overlapping the bending area, a via pattern penetrating the base film and electrically coupling the first line and the second line, and a common line coupled to the first line and to the integrated circuit chip, wherein at least a portion of the first line does not overlap at least a portion of the second line in a plan view.

The common line may extend in a first direction, and the first line may be symmetrical to the second line about an axis along the first direction.

The common line might not overlap the bending area.

The first line may include a first upper extension part, a first lower extension part spaced from and facing the first upper extension part, and a first intermediate line coupling the first upper extension part and the first lower extension part, and the second line may include a second upper extension part, a second lower extension part spaced from and facing the second upper extension part, and a second intermediate line coupling the second upper extension part and the second lower extension part.

A width of the first intermediate line may be smaller than a width of the first upper extension part and a width of the first lower extension part, and a width of the second intermediate line may be smaller than a width of the second upper extension part and a width of the second lower extension part.

The first intermediate line might not overlap the second intermediate line in a plan view.

The first upper extension part may overlap the second upper extension part in a plan view, and the first lower extension part may overlap the second lower extension part in a plan view.

The via pattern may include a first via pattern coupling the first upper extension part and the second upper extension part, and a second via pattern coupling the first lower extension part and the second lower extension part.

According to the above, although one of the first and second lines overlapping the bending area is cracked, signals may be normally transmitted through the other one of the first and second lines. In addition, because the first intermediate line and the second intermediate line do not overlap each other, the stress may be distributed. Further, the first intermediate line and the second intermediate line are at different positions from each other, and thus the first intermediate line and the second intermediate line are not substantially simultaneously cracked, even though the same external impact is applied to the first intermediate line and the second intermediate line.

BRIEF DESCRIPTION OF THE DRAWINGS

The above and other aspects of embodiments of the present invention will become readily apparent by reference to the following detailed description when considered in conjunction with the accompanying drawings, wherein.

DETAILED DESCRIPTION

Figure 1:
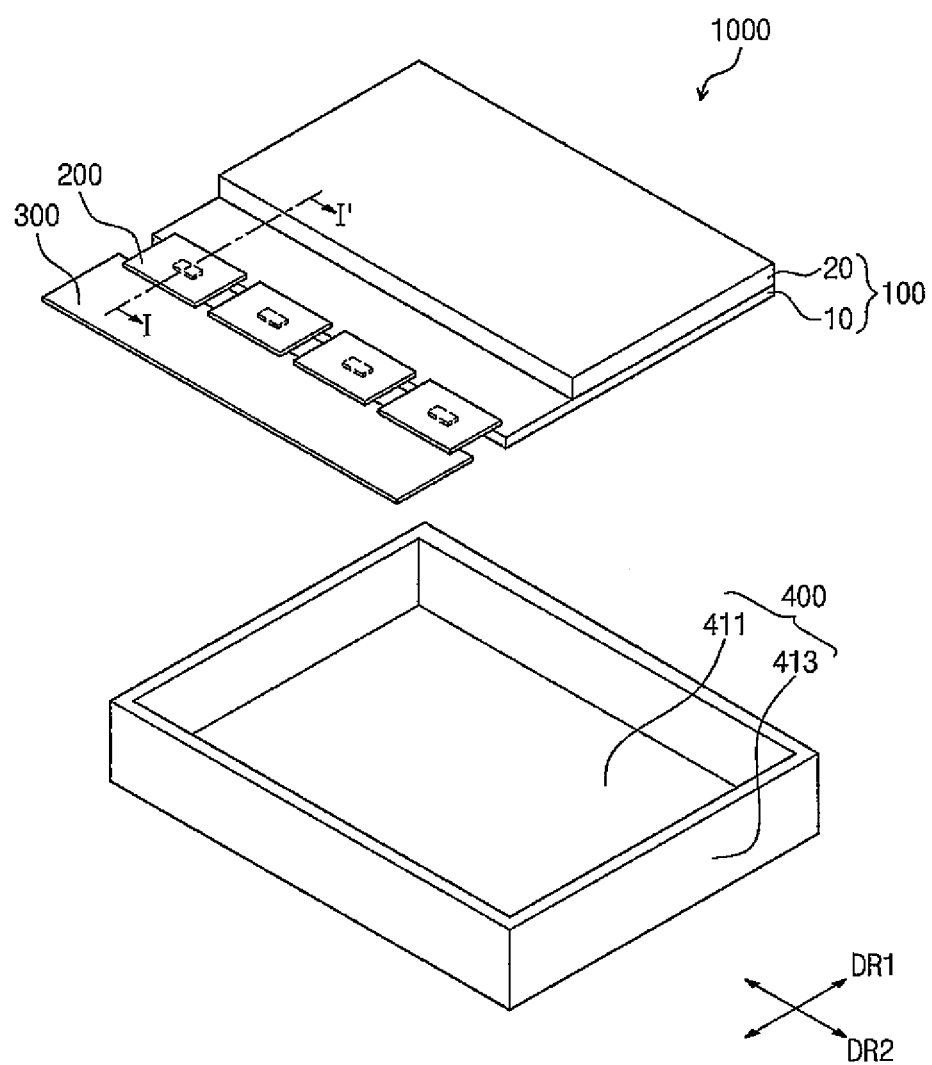
FIG. 1 is a perspective view showing a display device according to an exemplary embodiment of the present invention.

In the present description, it will be understood that when an element or layer is referred to as being "on," "connected to," or "coupled to" another element or layer, it can be directly on, connected to, or coupled to the other element or layer, or one or more intervening elements or layers may be present. In contrast, when an element is referred to as being "directly on," "directly connected to," or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. Instead, these terms are only used to distinguish one element, component, region, layer, or section from another region, layer, or section. Thus, a first element, component, region, layer, or section discussed below could be termed a second element, component, region, layer, or section without departing from the spirit and scope of the present invention.

Spatially relative terms, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or in operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (e.g., rotated 90 degrees, or at other orientations) and the spatially relative descriptors used herein interpreted accordingly.

The terminology used herein is for the purpose of describing particular embodiments only, and is not intended to be limiting of the disclosed embodiments. As used herein, the singular forms, "a," "an," and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art, and will not be interpreted in an idealized or overly formal sense unless expressly so defined herein.

Hereinafter, embodiments of the present invention will be explained in detail with reference to the accompanying drawings.

Figure 2:
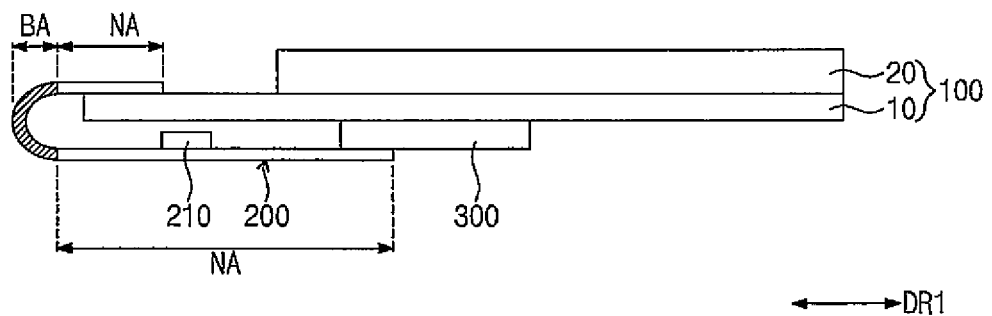
FIG. 2 is a cross-sectional view taken along the line I-I' of FIG. 1.

FIG. 1 is a perspective view showing a display device 1000 according to an exemplary embodiment of the present invention, and FIG. 2 is a cross-sectional view taken along the line I-I' shown in FIG. 1. Referring to FIGS. 1 and 2, the display apparatus 1000 includes a display panel 100, a chip-on-film package (hereinafter, referred to as a COF package) 200, a printed circuit board 300, and a chassis 400.

The display panel 100 may be an organic light emitting display panel, a liquid crystal display panel, a plasma display panel, an electrophoretic display panel, or an electrowetting display panel. Hereinafter, the display panel 100 will be described as an organic light emitting display panel.

The display panel 100 displays an image, and includes a first substrate 10 and a second substrate 20. The first substrate 10 includes a plurality of pixels arranged in a matrix in a display area thereof. In addition, the first substrate 10 further includes a gate driver and a data driver to drive the pixels.

The first substrate 10 has an area wider than that of the second substrate 20 when viewed in a plan view. A pad electrode is located on a region of the first substrate 10 that does not overlap the second substrate 20. The pad electrode is electrically coupled to the gate driver and to the data driver. A signal applied to the pad electrode is applied to the gate driver and to the data driver.

The second substrate 20 is coupled to the first substrate 10 to seal the pixels, circuits, and wires, which are formed on the first substrate 10, from an external environment. Although not shown in the figures, the display panel 100 may further include a polarizing film attached to a surface of the second substrate 20 to reduce or prevent reflection of an external light.

The COF package 200 electrically couples the display panel 100 to the printed circuit board 300. The COF package 200 includes a base film and an integrated circuit chip 210 formed on the base film.

With respect to a first direction DR1, one end portion of the COF package 200 is bonded to the pad electrode to be coupled to the display panel 100. With respect to a direction that is opposite the first direction DR1, the other end portion of the COF package 200 is bonded to the printed circuit board 300 to be electrically coupled to the printed circuit board 300.

FIG. 1 shows four COF packages 200 that are arranged in a second direction DR2 that is substantially perpendicular to the first direction DR1, and that are spaced apart from each other, although the number of the COF packages 200 in other embodiments of the present invention is not limited to four.

As shown in FIG. 2, the COF package 200 is bent to have a C shape, or a rotated U shape, and is mounted on the display panel 100. The COF package 200 extends from an upper surface of the first substrate 10, further extends along a side surface of the first substrate 10, and is fixed to a lower surface of the first substrate 10. To this end, the COF package 200 may be flexible.

The printed circuit board 300 drives the display panel 100, and includes a driving board with a plurality of circuits mounted thereon. The printed circuit board 300 is mounted on the lower surface of the first substrate 10, while the COF package 200 is bent and mounted on the printed circuit board 300.

The chassis 400 includes a bottom surface 411 and a sidewall portion 413 extending upward from edges of the bottom surface 411. The chassis 400 provides a receiving space for accommodating the display panel 100, the COF package(s) 200, and the printed circuit board 300 therein.

Figure 3:
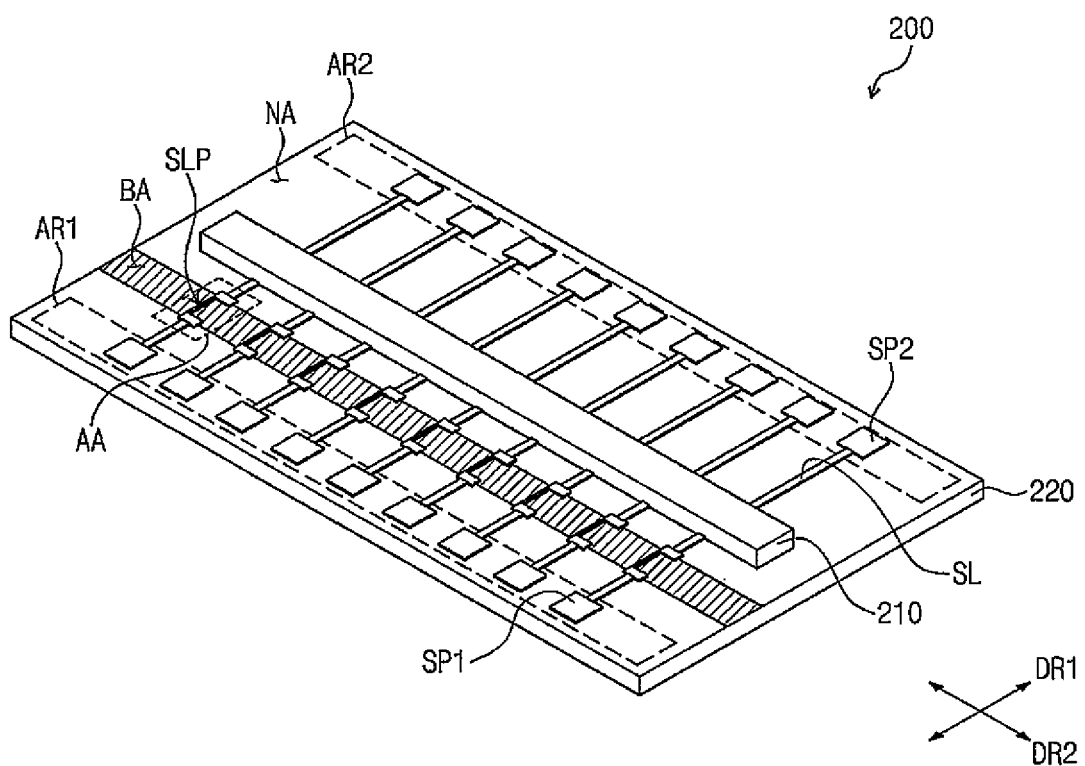
FIG. 3 is a perspective view showing a chip-on-film package shown in FIG. 1.

FIG. 3 is a perspective view showing one of the COF packages 200 shown in FIG. 1. Referring to FIGS. 2 and 3, the COF package 200 includes a base film 220, the integrated circuit chip 210, a line part SLP, a signal line SL, a first signal pad SP1, and a second signal pad SP2.

The COF package 200 includes a bending area BA and a non-bending area NA, and is bent in the bending area BA. The bending area BA has a uniform width in the first direction DR1, and extends in the second direction DR2.

Although the COF package 200 is bent, the bending of the COF package does not occur in the non-bending area NA. When viewed in a plan view, the non-bending area NA may correspond to an area or areas of the COF package 200 that are other than the bending area BA. The non-bending area NA includes a first bonding area AR1 and a second bonding area AR2. The first bonding area AR1 is bonded to the display panel 100, and the second bonding area AR2 is bonded to the printed circuit board 300. The first bonding area AR1 and the second bonding area AR2 respectively correspond to the end portions of the COF package 200 in the first direction DR1/direction opposite the first direction DR1. Each of the first bonding area AR1 and the second bonding area AR2 is spaced apart from the bending area BA. Meanwhile, the display panel 100 and the printed circuit board 300 are bonded to an upper surface of the COF package 200.

The bending area BA may be between the first bonding area AR1 and the integrated circuit chip 210, or may be between the second bonding area AR2 and the integrated circuit chip 210. FIG. 3 shows the portion of the area between the first bonding area AR1 and the integrated circuit chip 210 as the bending area BA.

The base film 220 may be flexible, and includes an upper surface, and a lower surface opposite the upper surface.

The line part SLP couples the integrated circuit chip 210 to the first signal pad SP1, and the signal line SL couples the integrated circuit chip 210 to the second signal pad SP2. Each of the line part SLP and the signal line SL may be provided in a plural number. The line parts SLP are spaced apart from the signal lines SL. At least a portion of the line part SLP overlaps the bending area BA. Detailed descriptions regarding the line part SLP will be described later.

The signal line SL does not overlap the bending area BA. The signal line SL may have the same width in the second direction DR2 as that of a common line of the line part SLP, which will be described later.

The integrated circuit chip 210 is located on an upper surface of the base film 220. The integrated circuit chip 210 receives a driving voltage and a driving signal from the printed circuit board 300 through the second signal pad SP2 and the signal line SL, which are located on the second bonding area AR2. The integrated circuit chip 210 generates a gate signal and a data signal in response to the driving voltage and the driving signal, and outputs the gate signal and the data signal to the first signal pad SP1 located on the first bonding area AR1 through the line part SLP. The signals applied to the first signal pad SP1 are applied to the display panel 100 (refer to FIG. 1) that is electrically coupled to the first signal pad SP1.

Figure 4:
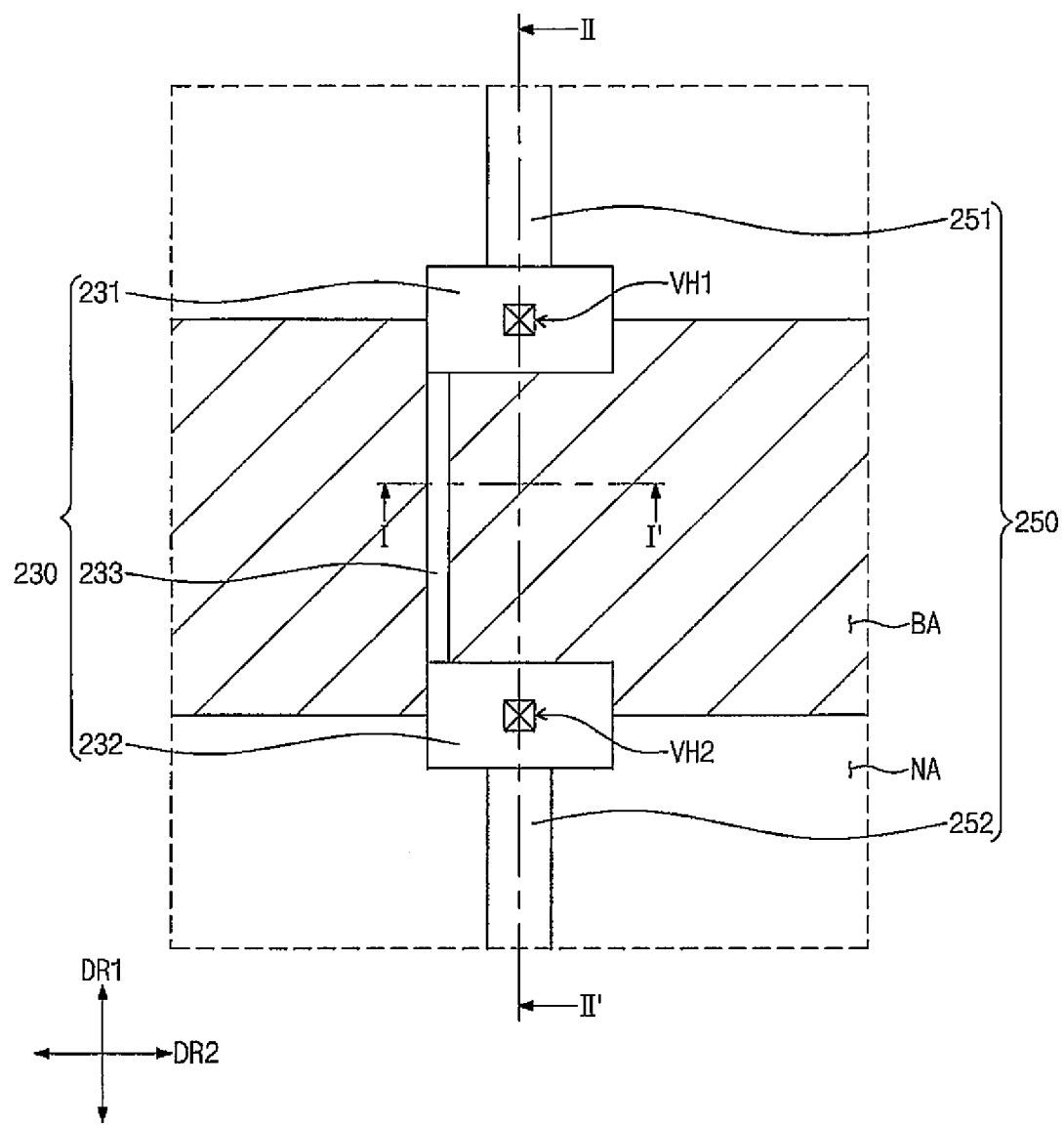
FIG. 4 is an enlarged plan view showing a portion AA of FIG. 3.
Figure 5:
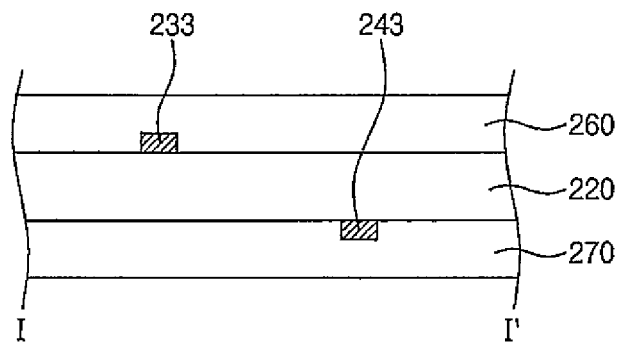
FIG. 5 is a cross-sectional view taken along the line I-I' of FIG. 4.
Figure 6:
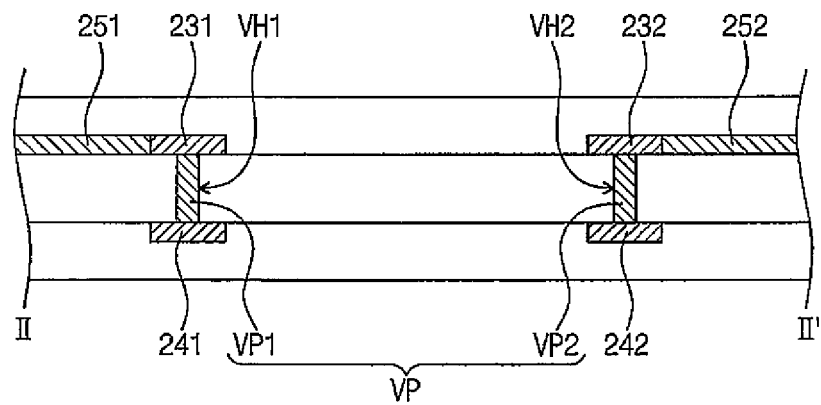
FIG. 6 is a cross-sectional view taken along the line II-II' of FIG. 4.
Figure 7:
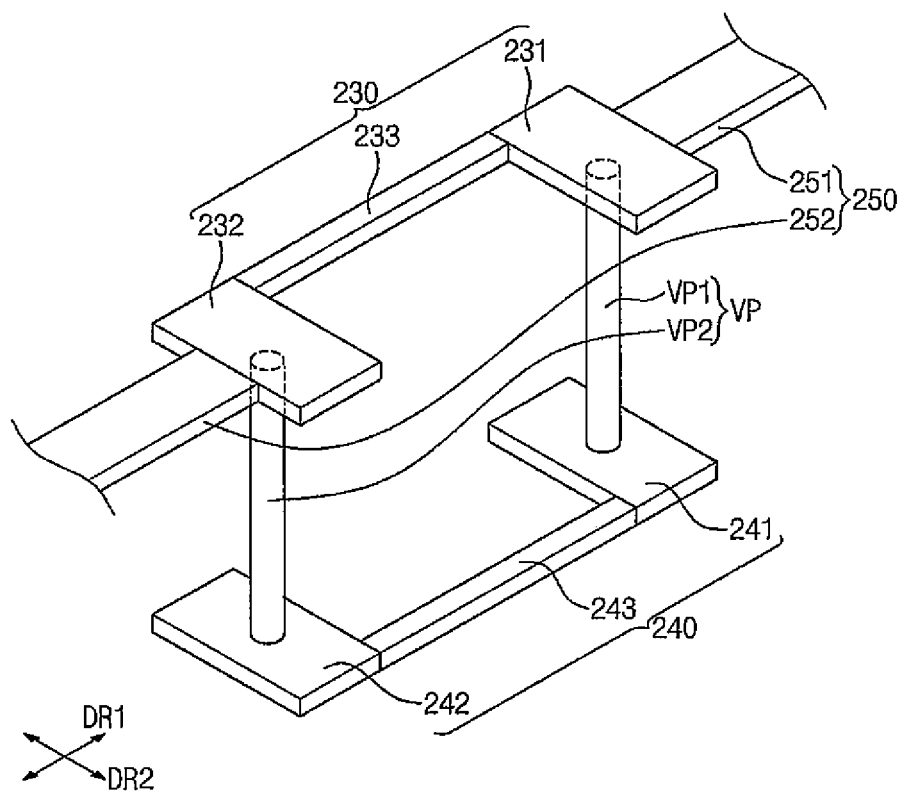
FIG. 7 is a perspective view showing a line part of FIG. 3.

FIG. 4 is an enlarged plan view showing a portion AA shown in FIG. 3, FIG. 5 is a cross-sectional view taken along the line I-I' shown in FIG. 4, FIG. 6 is a cross-sectional view taken along the line II-II' shown in FIG. 4, and FIG. 7 is a perspective view showing the line part shown in FIG. 3. Referring to FIGS. 4 to 7, the line part SLP includes a first line 230, a second line 240, a common line 250, and a via pattern VP.

The first line 230 is formed on the upper surface of the base film 220, and overlaps the bending area BA. When viewed in a plan view, the first line 230 is arranged in the first direction DR1 to cross the bending area BA. The first line 230 includes a first upper extension part 231, a first lower extension part 232, and a first intermediate line 233.

The first upper extension part 231 of the first line 230 covers the via pattern VP. The first lower extension part 232 of the first line is spaced apart from the first upper extension part 231 in the first direction DR1, and is located to face the first upper extension part 231. The first lower extension part 232 has the same shape as the first upper extension part 231 in a plan view. The first intermediate line 233 couples the first upper extension part 231 to the first lower extension part 232 in the first direction DR1. The first intermediate line 233 is coupled along the second direction DR2 to one end of the first upper extension part 231, and is coupled along the second direction DR2 to one end of the first lower extension part 232 corresponding to the one end of the first upper extension part 231. The first intermediate line 233 has a width along the second direction DR2, which is smaller than a width of each of the first upper extension part 231 and the first lower extension part 232 along the second direction DR2. In embodiments of the present invention, the first upper extension part 231, the first lower extension part 232, and the first intermediate line 233 may be integrally formed with each other.

The second line 240 is formed on a lower surface of the base film 220, and overlaps the bending area BA. When viewed in a plan view, the second line 240 crosses the bending area BA in the first direction DR1. The second line 240 includes a second upper extension part 241, a second lower extension part 242, and a second intermediate line 243.

The second upper extension part 241 of the second line 240 covers the via pattern VP. The second lower extension part 242 of the second line 240 is spaced apart from the second upper extension part 241 in the first direction DR1, and faces the second upper extension part 241. The second lower extension part 242 has the same shape as the second upper extension part 241 in a plan view. Further, in the present embodiment, the first upper extension part 231, the first lower extension part 232, the second upper extension part 241, and the second lower extension part 242 have the same shape in a plan view.

The second intermediate line 243 couples the second upper extension part 241 to the second lower extension part 242 along the first direction DR1, and does not overlap the first intermediate line 233 in a plan view.

The second intermediate line 243 is coupled along the second direction DR2 to one end of the second upper extension part 241, and is coupled along the second direction DR2 to one end of the second lower extension part 242 corresponding to the one end of the second upper extension part 241. The second intermediate line 243 has a width along the second direction DR2, which is smaller than a width of each of the second upper extension part 241 and the second lower extension part 242 along the second direction DR2. In embodiments of the present invention, the second upper extension part 241, the second lower extension part 242, and the second intermediate line 243 may be integrally formed with each other.

The first line 230 and the second line 240 are symmetrical to each other. In detail, the first line 230 and the second line 240 are symmetrical about an axis extending in the first direction DR1, or symmetrical to each other with respect to a line extended in the first direction DR1 (e.g., a straight line extended in the first direction DR1 and located at a center of the common line 250 with respect to the second direction DR2). In FIGS. 4 and 7, the first line 230 has a U shape rotated in a clockwise direction at about 90 degrees, and the second line 240 has a U shape rotated in a counter-clockwise direction at about 90 degrees.

The common line 250 is located on, the upper surface of the base film 220, is coupled to the first line 230, and does not overlap the bending area BA. The common line 250 includes a first common line 251 and a second common line 252.

The first common line 251 couples one end (e.g., a first end) of the first line 230 along the first direction DR1 to the integrated circuit chip 210 shown in FIG. 3. Particularly, the first common line 251 couples the first upper extension part 231 to the integrated circuit chip 210. The first common line 251 has a width in the second direction DR2 that is smaller than a width of the first upper extension part 231 in the second direction DR2.

The second common line 252 couples the other end (e.g., a second end) of the first line 230 along the first direction DR1 to the first signal pad SP1 shown in FIG. 3. Particularly, the second common line 252 couples the first lower extension part 232 to the first signal pad SP1. The first common line 251 and the second common line 252 extend along the first direction DR1, and are located on the same straight line. In embodiments of the present invention, the first line 230 and the common line 250 may be integrally formed with each other.

When viewed in a plan view, a via hole(s) is formed penetrating through the base film 220 in an area where the first line 230 and the second line 240 overlap. In detail, the via hole includes a first via hole VH1 at an area where the first upper extension part 231 and the second upper extension part 241 overlap in a plan view, and a second via hole VH2 at an area where the first lower extension part 232 and the second lower extension part 242 overlap in a plan view.

The via pattern(s) VP is located inside the via hole. The via pattern VP penetrates through the base film 220 and electrically couples the first line 230 to the second line 240. In detail, the via pattern VP includes a first via pattern VP1 located inside the first via hole VH1 to electrically couple the first upper extension part 231 to the second extension part 241, and a second via pattern VP2 located inside the second via hole VH2 to electrically couple the first lower extension part 232 to the second extension part 242.

In the present exemplary embodiment, two via holes and two via patterns have been described. However, the number of via holes and via patterns in other embodiments of the present invention is not limited thereto or thereby.

Referring to FIGS. 3, 5, and 6, the COF package 200 may further include a first protection layer 260 and a second protection layer 270, which may include an insulating material.

The first protection layer 260 is located on the upper surface of the base film 220, on the first line 230, on the common line 250, and on the signal line SL. The first protection layer 260 protects the first line 230, the common line 250, and the signal line SL. In the present embodiment, the first protection layer 260 does not correspond to the entire area of the base film 220, and the first protection layer 260 may include "exposing holes" to expose the first signal pad SP1 and the second signal pad SP2.

The second protection layer 270 is located on the lower surface of the base film 220, and on the second line 240. The second protection layer 270 protects the second line 240.

A crack may occur in the line overlapping the bending area BA of the COF package 200. The COF package 200 according to the present exemplary embodiment includes the first line 230, and the second line 240 facing the first line 230 and coupled to the first line 230 by the via pattern VP, while interposing the base film 220 between the first and second lines 230 and 240. Thus, although one of the first signal line 230 and the second signal line 240 may be cracked, signals are normally transmitted through a remaining one of the lines 230 and 240.

When viewed in a plan view, the first intermediate line 233 and the second intermediate line 243 do not overlap, and thus a stress applied thereto may be distributed. In addition, the first intermediate line 233 and the second intermediate line 243 are located at different positions from each other, and thus, the first intermediate line 233 and the second intermediate line 243 are not substantially simultaneously cracked, even though the same external impact is applied to the first intermediate line 233 and the second intermediate line 243.

In addition, because the common line 250 and the signal line SL do not overlap the bending area BA, the crack does not occur in the common line 250 and the signal line SL. As described above, when the line part SLP overlapped with the bending area BA is designed to have a double-wiring structure, a structural stability may be improved.

Although the exemplary embodiments of the present invention have been described, it is to be understood that the present invention is not limited to these exemplary embodiments, and various changes and modifications can be made by one ordinary skilled in the art within the spirit and scope of the present invention as hereinafter claimed by the following claims and their equivalents.

What is claimed is:

1. A chip-on-film package comprising:
   a base film comprising a bending area;
   an integrated circuit chip at an upper surface of the base film;
   a first line at the upper surface of, the base film and overlapping the bending area;
   a second line at a lower surface of the base film and overlapping the bending area;
   a via pattern penetrating the base film to electrically couple the first line and the second line; and
   a common line coupled to the first line and to the integrated circuit chip, wherein the first line comprises:
- a first upper extension part;
- a first lower extension part spaced apart from the first upper extension part; and
- a first intermediate line coupling the first upper extension part and the first lower extension part, wherein the second line comprises:
- a second upper extension part facing the first upper extension part;
- a second lower extension part spaced apart from the second upper extension part and facing the first lower extension part; and
- a second intermediate line coupling the second upper extension part and the second lower extension part, and wherein the first intermediate line does not overlap the second intermediate line in a plan view.

2. The chip-on-film package of claim 1, wherein the common line extends along a first direction, and
wherein the first line and the second line are symmetrical to each other about an axis extending along the first direction.

3. The chip-on-film package of claim 1, wherein the common line does not overlap the bending area.

4. The chip-on-film package of claim 3, wherein the common line comprises:
- a first common line coupling a first end of the first line to the integrated circuit chip; and
- a second common line coupled to a second end of the first line.

5. The chip-on-film package of claim 1, wherein the first line and the second line extend across the bending area.

6. The chip-on-film package of claim 1, wherein each of the first and second lines extends across the bending area from one side of the bending area to another side of the bending area, and
wherein at least a portion of the first line extending across the bending does not overlap at least a portion of the second line extending across the bending area in a plan view.

7. The chip-on-film package of claim 1, wherein a width of the first intermediate line is smaller than a width of the first upper extension part and a width of the first lower extension part, and
wherein a width of the second intermediate line is smaller than a width of the second upper extension part and a width of the second lower extension part.

8. The chip-on-film package of claim 1, wherein the first upper extension part overlaps the second upper extension part in a plan view, and
wherein the first lower extension part overlaps the second lower extension part in a plan view.

9. The chip-on-film package of claim 1, wherein the via pattern comprises:
- a first via pattern coupling the first upper extension part and the second upper extension part; and
- a second via pattern coupling the first lower extension part and the second lower extension part.

10. The chip-on-film package of claim 1, further comprising:
- a first protection layer at the upper surface of the base film to protect the first line and the common line; and
- a second protection layer at the lower surface of the base film to protect the second line.

11. A display device comprising:
- a display panel for displaying an image;
- a printed circuit board for driving the display panel; and
- a chip-on-film package for electrically coupling the display panel and the printed circuit board, the chip-on-film package comprising:
  - a base film comprising a bending area;
  - an integrated circuit chip at an upper surface of the base film;
  - a first line at the upper surface of the base film and overlapping the bending area;
  - a second line at a lower surface of the base film and overlapping the bending area;
  - a via pattern penetrating the base film and electrically coupling the first line and the second line; and
  - a common line coupled to the first line and to the integrated circuit chip, wherein the first line comprises:
- a first upper extension part;
- a first lower extension part spaced apart from the first upper extension part; and
- a first intermediate line coupling the first upper extension part and the first lower extension part, wherein the second line comprises:
- a second upper extension part facing the first upper extension part;
- a second lower extension part spaced apart from the second upper extension part and facing the first lower extension part; and
- a second intermediate line coupling the second upper extension part and the second lower extension part, and wherein the first intermediate line does not overlap the second intermediate line in a plan view.

12. The display device of claim 11, wherein the common line extends in a first direction, and
wherein the first line is symmetrical to the second line about an axis along the first direction.

13. The display device of claim 11, wherein the common line does not overlap the bending area.

14. The display device of claim 11, wherein each of the first and second lines extends across the bending area from one side of the bending area to another side of the bending area, and
wherein at least a portion of the first line extending across the bending area does not overlap at least a portion of the second line extending across the bending area in a plan view.

15. The display device of claim 11, wherein a width of the first intermediate line is smaller than a width of the first upper extension part and a width of the first lower extension part, and
wherein a width of the second intermediate line is smaller than a width of the second upper extension part and a width of the second lower extension part.

16. The display device of claim 11, wherein the first upper extension part overlaps the second upper extension part in a plan view, and
wherein the first lower extension part overlaps the second lower extension part in a plan view.

17. The display device of claim 11, wherein the via pattern comprises:
- a first via pattern coupling the first upper extension part and the second upper extension part; and
- a second via pattern coupling the first lower extension part and the second lower extension part.

18. A chip-on-film package comprising:
- a base film comprising a bending area;
- an integrated circuit chip at an upper surface of the base film;

a first line at the upper surface of the base film and overlapping the bending area;
a second line at a lower surface of the base film and overlapping the bending area;
a via pattern penetrating the base film to electrically couple the first line and the second line; and
a common line coupled to the first line and to the integrated circuit chip,
wherein each of the first and second lines extends across the bending area from one side of the bending area to another side of the bending area,
wherein at least a portion of the first line extending across the bending area does not overlap at least a portion of the second line extending across the bending area in a plan view, and
wherein ends of the first line correspond to ends of the second line in a vertical direction.

* * * * *